Aug. 8, 1967 E. R. COOK ETAL 3,334,395

METHOD OF MAKING A METAL PRINTED CIRCUIT BOARD

Original Filed Nov. 26, 1962

INVENTORS:
Eldon R. Cook
John S. Miller

By Willard M. Graham

Agent 3,334,395

METHOD OF MAKING A METAL PRINTED CIRCUIT BOARD

Eldon R. Cook, Sepulveda, and John S. Miller, Camarillo, Calif., assignors to Northrop Corporation, Beverly Hills, Calif., a corporation of California Original application Nov. 26, 1962, Ser. No. 240,100. Divided and this application July 29, 1963, Ser. No. 298,321
6 Claims. (Cl. 29—625)

The present invention relates to printed electrical circuits, and more particularly, to a method for providing such circuitry capable of being adequately cooled below a safe operating temperature, and this invention is a division of our copending application Ser. No. 240,100, filed Nov. 26, 1962, now abandoned.

With more and more emphasis being placed on reducing the size and weight of electrical and electronic components, circuits, and assemblies, a major problem encountered has been adequate removal of heat generated by the closely spaced components. Many schemes have been devised for carrying off heat, including conduction to heat sinks, cooling fins for radiating off heat, and various methods employing air for cooling, ranging from simple ventilating means to elaborate forced air cooling using ducts, blowers, and other additional equipment. For large and complex electronic equipment, the cooling systems have also become immense. For use with printed type circuitry, carrying heat generating components on cards or wafers, cooling systems have not been completely satisfactory or efficient for several reasons, one being that the circuit boards themselves are poor heat conductors and hot areas thus develop which are not sufficiently reached by the cooling air.

It is an object of this invention to provide a printed circuit having a base or substrate that is a good conductor of heat, so that means can be provided for carrying off heat through the edges of the base.

If a metal base or circuit board is to be used, electrical insulation must be provided so that circuit components and wiring are not short-circuited together or to the base itself.

Therefore, another object of this invention is to provide a means and method of insulating an electrically conductive substrate from the printed circuitry thereon.

A further object is to provide a printed circuit construction having a heat conductive base which is light in weight and simple and economical to manufacture.

It is a still further object of the present invention to provide a printed circuit construction having a light weight heat conductive base and electrically conductive holes therethrough which are electrically insulated from the conductive base.

It is known that attempts have been made to utilize the electrical insulation and heat conduction properties of anodized aluminum, for example, in making printed circuit panels. These attempts have comprised plating of copper or other conductive metals on the anodized coating. But no successful product has yet resulted from such a method. The plating has short-circuited through the porous anodized coating to the aluminum base, or the copper plating has not adhered to the anodized panel, but has peeled off easily when pulled.

Thus, it is an additional object of our invention to provide a successful printed electrical circuit on an anodized aluminum or similar metal base panel.

Other objects and advantages of the invention will be noted in the detailed description of preferred embodiments to follow.

Briefly, our invention comprises a method of producing a light-weight metal panel having an oxidized or anodized coating on the surface thereof and on the wall of holes therethrough, and an electrically conductive metal bonded to the said coating both on the surface and through the desired holes, this bonded metal adapted to form the conductors and connections of a desired printed circuits; the said method comprising the steps of drilling a plain metal base panel, anodizing or oxidizing one or both sides and the interior of the drilled holes, bonding conductive metal foil to at least one side of the oxidized panel, redrilling the holes leaving a wall thickness of bonding material, and then plating the foil and the bonding material in the holes with an electrically conductive metal, so that conventional printed circuit techniques may then be followed to form the desired circuit pattern. In some instances, the oxide coating may be eliminated, leaving only the bonding material to insulate the circuit conductors from the base panel.

The invention will be more fully understood by referring to the following detailed description of specific examples, and to the accompanying drawings, wherein.

Figure 1:
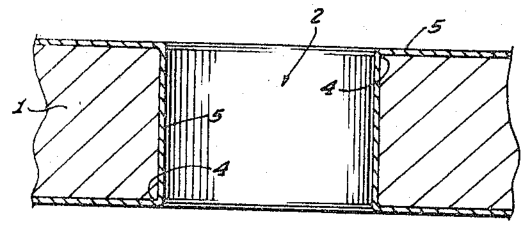
FIGURE 1 is a cross-section view of a base panel through a drilled hole therein, illustrating the first steps in the practice of the present invention.

Referring first to FIGURE 1, a panel 1 of aluminum, or aluminum alloy 6061 or 7075 for example, is predrilled to form a hole 2 at a position where a conductive hole is desired to be located in the final article, and this hole 2 is drilled oversize for a purpose and in an amount which will be explained later. It will be understood that the final conductive wall of hole 2 is for the purpose of interconnecting conductors on opposite sides of the panel, and for electrically connecting the ends of wire leads to the circuitry at such holes. Therefore, the size of the final hole 2 is suitable for such wire leads. Panel 1 is a plane sheet of metal which may be about 1/16 inch thick, although this is not critical. The edges 4 of the hole 2 are preferably rounded slightly.

The panel 1 is now given a hard anodized treatment to form as thick an anodized coating 5 as possible, approximately .003 inch for example. The anodized coating 5 is formed on the wall of hole 2 as well as on the surfaces of the panel 1. The article now appears as shown in FIGURE 1. Before the following step, the anodized panel is preferably degreased and dried in a 250 F. oven for 30 minutes.

Figure 2:
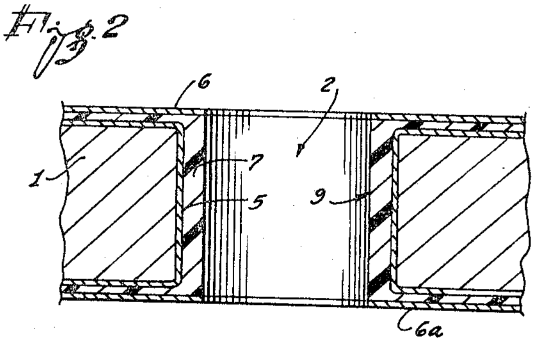
FIGURE 2 is a similar cross-section view illustrating further steps of the invention.

Next, referring to FIGURE 2, a sheet of copper foil 6, about .0015 inch thick for example, is bonded to one side of the panel 1 with a bonding compound 7 such as an epoxy adhesive. One satisfactory bonding material is known as FM1000, manufactured by Bloomingdale Rubber Co., Aberdeen, Md. This bonding material is a dry sheet in uncured form, preferably about .010 inch thick, and the bonding process is preferably carried out at a pressure of 100 p.s.i. and a temperature of 350° F. for a period of 45 minutes. This is about one-half the time required to completely cure the material 7. The bonding material 7 will squeeze out to form a final thickness of about .002 to .004 inch and will extrude into and fill the drilled holes 2 in the panel.

Since printed circuitry usually occupies both sides of the panel, a similar sheet of copper foil *6a* is now bonded to the second side, using an initial bonding material thickness of .005 inch, and curing at 350° F. and 100 p.s.i. for 90 minutes. This completely cures the bonding material on this second side and finishes curing the bonded material on the first side. Each side is bonded with foil separately so that no air bubbles will be trapped in the hole 2, which would leave an exposed portion of the anodized coating 5 when the hole is redrilled. Of course, different curing procedures will be used with other bonding materials.

After this, the circuit hole 2 is redrilled, this time leaving a protective wall 9 of bonding material about .010 inch thick, to form a base for subsequent sensitizing to adhere to. The panel 1 now has the appearance as shown in FIGURE 2.

Now the wall 9 of bonding material is sensitized to accept copper plating. The bonding material wall 9 must be present, since the sensitizing does not adhere to the anodized coating 5, and the sensitizing can also permeate through any thin or porous anodic coating and attack the base metal. After sensitizing, the panel 1 is copper plated through the holes over the bonding material wall 9. This will plate the hole wall with a plating 10 (as shown in FIGURE 3) about .0015 inch thick and will also add about that much thickness to the copper foil 6 on the main surfaces of the panel 1.

Figure 3:
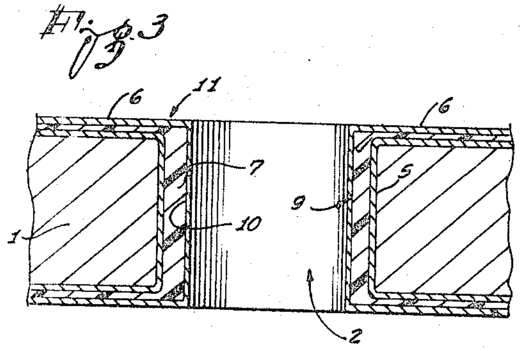
FIGURE 3 is a similar cross-section illustrating the remaining steps of the invention.

At this point, the composite panel unit 11 appears as in FIGURE 3, which is its final form ready for formation of the desired circuit patterns. The hole 2 is now final size. It will be seen that the diameter of the first hole 2 as drilled in the aluminum stock of FIGURE 1 should be final desired size plus about .027 inch in this instance, including about .001 inch for hole shrinkage.

This completes the description of the present invention as applied to this one preferred embodiment. The panel unit 11 of FIGURE 3 may now be treated in a conventional manner to produce the desired printed circuit thereon. This might include photographing an image on the panel, with "resist" applied; plating the circuit parts with gold; stripping off the "resist;" etching the unwanted copper plate and foil with chromic acid; and further plating with copper and finishing as desired.

Figure 4:
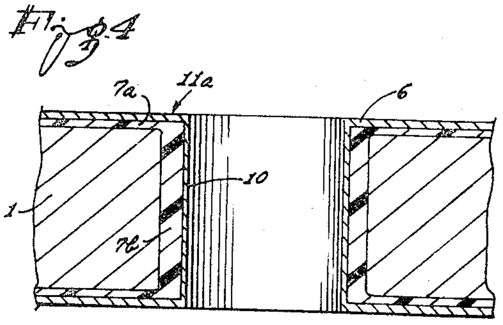
FIGURE 4 is a cross-section view of a printed circuit panel through a conductive hole therein, illustrating a completed different embodiment of this invention.

It will be understood that the method described with respect to the holes 2 is for "plated through" holes only, where an electrical path is desired from one side of the panel 1 to the other at the hole. Where other holes might be required that are not the "plated through" type, it is obvious that they will be formed differently, such as by redrilling again, out to the bonding material wall 9, or by drilling completely new holes at any required places on the finished panel as a last step.

Where no plated-through holes are required, or where greater care is taken in the production of a complete film of bonding material 7, the panel construction 11*a* of FIGURE 4 is an alternate embodiment of the present invention. Here, the anodized coating of the previous example is completely eliminated and the bonding material at 7*a* and 7*b* alone forms the required electrical insulation between the copper foil 6 (and the subsequent copper plating 10) on the outside and the aluminum base panel 1 on the inside. As stated, extra care must be taken in securing a complete coating of bonding material 7*b* on the entire inside wall of the hole, but no problem is found in securing a good film of bonding material 7*a* on the panel surfaces.

Figures 5, 6:
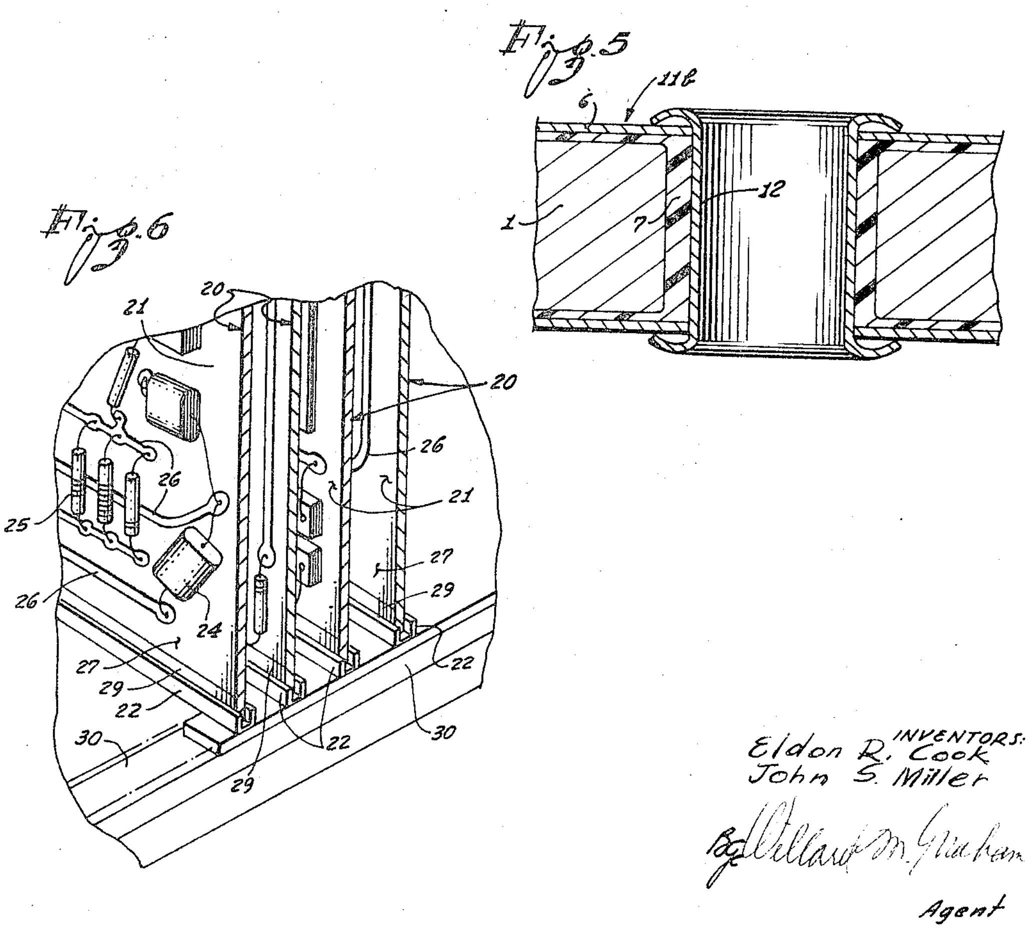
FIGURE 5 is a cross-section of a printed circuit panel through a conductive hole therein, illustrating a completed third embodiment of the invention.
FIGURE 6 is a partial perspective view of a series of panels constructed according to this invention, showing how they may be utilized in a stacked relation in supporting structure which draws off heat from the panels.

FIGURE 5 shows another embodiment of panel unit 11*b* which may be used without first providing an anodized coating on the panel 1. This is where a conventional metal eyelet 12 or other suitable connector is used in place of the copper plating 10 within the hole. The bonding of the foil 6 remains the same, but the sensitizing and plating steps within the hole are not necessary in view of the conductive eyelet 12. It is seen that this construction insures positive insulation between the printed circuit and the panel base 1 even if an air hole should be present in the bonding material 7 inside the hole. The eyelet 12 is preferably installed after the desired circuit pattern is formed.

The invention thus far has mentioned only aluminum in particular for the panel base. However, other and lighter metals, such as magnesium and magnesium alloys, for example, may be employed using the same or similar techniques.

The bonding material employed herein may be any suitable epoxy adhesive as already mentioned or may be some other resin adhesive such as a phenolic for example, anything which has adequate bonding and dielectric qualities and which will withstand the heat of soldering and plating operations.

It is thus seen that a workable printed circuit construction has been accomplished on an excellent heat conductive base. Heat generated by electronic components mounted on this panel may be easily drawn away by and through the metal base to further heat sink means if necessary, by conduction through physical contact.

As shown in FIGURE 6, for example, a number of electronic assemblies or modules 20 are formed, installed, or otherwise secured to respective panels 21 which are initially prepared in accordance with the present invention. The panels 21 are mounted by sliding into grooves of heat conductive channels 22 which are provided along one or more edges of the panels 21. Electronic components such as 24 and 25 are electrically connected to conductors 26 which have been produced on the metal foil previously described herein. It will be recognized that electrical plug means (not shown) is provided in a customary manner for each panel 21, such as by printed circuit fingers projecting from one side of a panel, for example.

Panel surfaces 27 between conductors 26 may be composed of the anodized or oxidized coating from which the foil has been removed. In this case, it is preferable to remove the oxidized coating along strips 29 adjacent to the panel edges, on both sides of the panel, so that the bare metal base of the panel is in direct contact with the channels 22. Thus, heat absorbed by panels 21 from components 24 and 25 can flow without impediment through the edge strips 29, channels 22, and thence to the housing 30 of the equipment in which the panels 21 are installed.

It is obvious that the applications of this invention are innumerable.

The term "printed circuit" in this description and in the appended claims is used in its broadest sense, and is meant to encompass any type of construction comprising electrical or electronic elements provided in any manner on a panel as described herein, either known now or developed later, such as composite microminiature, grown, or solid integrated circuitry for instance.

Expensive and elaborate air cooling fans and systems may thus be eliminated by the teachings of our present invention. Magnesium panels are lighter in weight than the comparable fiberglass boards. The present method is easily accomplished and the final article is simple in form.

While in order to comply with the statute, the invention has been described in language more or less specific as to structural features, it is to be understood that the invention is not limited to the specific features shown, but that the means and construction herein disclosed comprise a preferred form of several modes of putting the invention into effect, and the invention is therefore claimed in any of its forms or modifications within the legitimate and valid scope of the appended claims.

What is claimed is:

1. The method of making a panel unit for a printed electrical circuit including a plated-through circuit hole, comprising:

drilling plural oversize holes to extend through a metal panel, disposing a sheet of uncured, heat curable, bonding material on one side of said panel to overlie said holes, disposing a conductive metal foil to overlie said sheet of uncured bonding material, pressing the foil and heating the assembly to simultaneously extrude the bonding material into said holes to fill said holes and to cure the bonding material to render the foil secured to said one side of said panel, redrilling said holes smaller through said foil and said bonding material to leave a wall of cured bonding material in said redrilled holes, and plating a coating of electrically conductive metal on the bonding material in said holes and on said foil to make an electrical contact from one side of said panel unit to the other.

2. Method in accordance with claim 1 wherein the edges of said oversize holes are rounded slightly after drilling said oversized holes.

3. Method in accordance with claim 1 wherein an oxide coating is formed on said panel and on the walls of said holes after drilling said oversized holes.

4. The method of making a panel unit for a two-sided printed electrical circuit including plated-through circuit holes, comprising:

drilling oversized holes to extend through parallel sides of a metal panel, forming an oxide coating on both said sides of said panel and on the walls of said holes, disposing a sheet of uncured, heat curable, bonding material on one side of said oxide coated panel, disposing a conductive metal foil to overlie said sheet of uncured bonding material, pressing the foil and heating the assembly to simultaneously extrude the bonding material into the holes to fill said holes and to cure the bonding material to render the foil secured to said one side of said oxide coated panel, bonding an electrically conductive metal foil to the opposite side of said oxide-coated panel with similar bonding material, redrilling said holes smaller through said foils and said bonding material to leave walls of cured bonding material in said redrilled holes, and plating a coating of electrically conductive metal on the bonding material in said holes and on said foils to make electrical connections from one side of said panel unit to the other.

5. Method in accordance with claim 4 wherein the thickness of the sheet of uncured bonding material used in the hole filling and bonding step is appreciably greater than the thickness of the sheet of bonding material used to bond the foil to said opposite side.

6. Method in accordance with claim 4 wherein the period of time used to bond said foil to said one side is approximately half the period of time used to bond said foil to said opposite side.

References Cited

UNITED STATES PATENTS

| | | | |
|---|---|---|---|
| 1,861,663 | 6/1932 | Lahey | 156—293 |
| 2,897,409 | 7/1959 | Gitto | 174—68.5 |
| 3,148,356 | 9/1964 | Hedden | 174—68.5 X |
| 3,165,672 | 1/1965 | Gellert | 174—68.5 X |

JOHN F. CAMPBELL, *Primary Examiner.*

R. W. CHURCH, *Examiner.*